United States Patent
Kwak et al.

(10) Patent No.: US 11,087,830 B2
(45) Date of Patent: Aug. 10, 2021

(54) SEMICONDUCTOR DEVICES

(71) Applicant: SK hynix Inc., Icheon-si (KR)

(72) Inventors: Myung Kyun Kwak, Yongin-si (KR); Min O Kim, Seoul (KR); Min Wook Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/906,704

(22) Filed: Jun. 19, 2020

(65) Prior Publication Data

US 2021/0183431 A1    Jun. 17, 2021

(30) Foreign Application Priority Data

Dec. 16, 2019  (KR) .......................... 10-2019-0168082

(51) Int. Cl.
  *G11C 7/00*    (2006.01)
  *G11C 11/4096*  (2006.01)
(52) U.S. Cl.
  CPC .............................. *G11C 11/4096* (2013.01)
(58) Field of Classification Search
  CPC .................................................. G11C 11/4096
  USPC .................................................... 365/189.16
  See application file for complete search history.

(56) References Cited

U.S. PATENT DOCUMENTS

| 9,620,194 B1* | 4/2017 | Lee .................. G11C 11/40615 |
| 10,026,463 B1* | 7/2018 | Kwak ..................... G11C 7/222 |
| 2014/0126301 A1* | 5/2014 | Yoon .................. G11C 29/4401 |
| | | 365/189.04 |

FOREIGN PATENT DOCUMENTS

KR    1020170088138 A    8/2017

OTHER PUBLICATIONS

Korean Application No. 10-2019-0029334, Mar. 14, 2019, "Semiconductor Devices", SK hynix Inc.

\* cited by examiner

*Primary Examiner* — Vu A Le
(74) *Attorney, Agent, or Firm* — William Park & Associates Ltd.

(57) ABSTRACT

A semiconductor device includes a flag pipe, a pattern mode control circuit, and a data copy control circuit. The flag pipe is configured to latch a pattern mode flag, a first pattern control flag, a second pattern control flag, a data copy flag, and an enlargement data copy flag based on a pipe input control signal and output a delayed pattern mode flag, a first delayed pattern control flag, a second delayed pattern control flag, and a synthesis data copy flag based on a pipe output control signal. The pattern mode control circuit is configured to set a first data pattern or a second data pattern based on the delayed pattern mode flag, the first delayed pattern control flag, and the second delayed pattern control flag. The data copy control circuit is configured to copy data inputted through a first data pad onto a data path electrically connected to a second data pad based on the synthesis data copy flag.

20 Claims, 17 Drawing Sheets

FIG.3

| CS | CLK | ICA<1> | ICA<2> | ICA<3> | ICA<4> | ICA<5> | ICA<6> | ICA<7> |
|---|---|---|---|---|---|---|---|---|
| H | rising edge | L | CAS L | H | H | X | X | X |
| X | falling edge | DCF<1> | DCF<2> | EDCF<1> | EDCF<2> | WRXF | PCNTA | PCNTB |

SEMICONDUCTOR DEVICES

CROSS-REFERENCE TO RELATED APPLICATIONS

The present application claims priority under 35 U.S.C 119(a) to Korean Application No. 10-2019-0168082, filed on Dec. 16, 2019, which is incorporated herein by reference in its entirety.

BACKGROUND

1. Technical Field

Embodiments of the present disclosure relate to semiconductor devices performing a write operation for a data pattern.

2. Related Art

Semiconductor devices such as dynamic random access memory (DRAM) devices perform a write operation and a read operation. The write operation is an operation for storing data into a bank including cell arrays selected by an address, and the read operation is an operation for outputting the data stored in the cell arrays included in the bank.

SUMMARY

According to an embodiment, a semiconductor device includes a flag pipe, a pattern mode control circuit, and a data copy control circuit. The flag pipe is configured to latch a pattern mode flag, a first pattern control flag, a second pattern control flag, a data copy flag, and an enlargement data copy flag based on a pipe input control signal and is configured to output a delayed pattern mode flag, a first delayed pattern control flag, a second delayed pattern control flag, and a synthesis data copy flag based on a pipe output control signal. The pattern mode control circuit is configured to set a first data pattern written through a first data path or a second data pattern written through a second data path based on the delayed pattern mode flag, the first delayed pattern control flag, and the second delayed pattern control flag. The data copy control circuit is configured to copy data inputted through a first data pad onto a third data path electrically connected to a second data pad based on the synthesis data copy flag.

According to another embodiment, a semiconductor device includes a flag generation circuit, a flag pipe, and a pattern mode control circuit. The flag generation circuit is configured to generate a pattern mode flag, a first pattern control flag, and a second pattern control flag based on an internal set signal and a write command after a write control command is generated based on the internal set signal. The flag pipe is configured to latch the pattern mode flag, the first pattern control flag, and the second pattern control flag based on a pipe input control signal and is configured to output a delayed pattern mode flag, a first delayed pattern control flag, and a second delayed pattern control flag based on a pipe output control signal. The pattern mode control circuit is configured to set a first data pattern written through a first data path or a second data pattern written through a second data path based on the delayed pattern mode flag, the first delayed pattern control flag, and the second delayed pattern control flag.

According to yet another embodiment, a semiconductor device includes a flag generation circuit, a flag pipe, and a data copy control circuit. The flag generation circuit is configured to generate a data copy flag and an enlargement data copy flag based on an internal set signal and a write command after a write control command is generated based on the internal set signal. The flag pipe is configured to latch the data copy flag and the enlargement data copy flag based on a pipe input control signal and is configured to output a synthesis data copy flag based on a pipe output control signal. The data copy control circuit is configured to copy data inputted through a first data pad onto a data path electrically connected to a second data pad based on the synthesis data copy flag.

BRIEF DESCRIPTION OF THE DRAWINGS

FIG. 3 is a table illustrating an operation that generates flags for controlling a pattern mode and a data copy mode of the semiconductor device shown in FIG. 2 according to an internal set signal.

DETAILED DESCRIPTION

In the following description, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
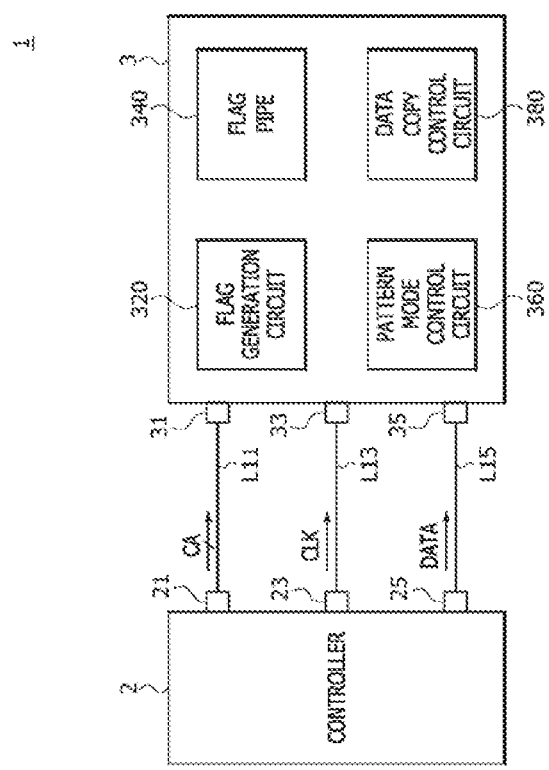
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 2 and a semiconductor device 3. The semiconductor device 3 may include a flag generation circuit 320, a flag pipe 340, a pattern mode control circuit 360, and a data copy control circuit 380.

The controller 2 may include a first control pin 21, a second control pin 23, and a third control pin 25. The semiconductor device 3 may include a first semiconductor pin 31, a second semiconductor pin 33, and a third semiconductor pin 35. The first control pin 21 and the first semiconductor pin 31 may be connected to each other by a first transmission line L11. The second control pin 23 and the second semiconductor pin 33 may be connected to each other by a second transmission line L13. The third control pin 25 and the third semiconductor pin 35 may be connected to each other by a third transmission line L15. The controller 2 may transmit a set signal CA to the semiconductor device 3 through the first transmission line L11 to control the semiconductor device 3. The set signal CA may include a command and an address. The controller 2 may transmit a clock signal CLK to the semiconductor device 3 through the second transmission line L13 to control the semiconductor device 3. The controller 2 may transmit data DATA to the semiconductor device 3 through the third transmission line L15.

The flag generation circuit 320 may generate flags for controlling a pattern mode and a data copy mode based on the set signal CA. The flags generated by the flag generation circuit 320 may be generated during a period which is longer than at least two cycles of the clock signal CLK. Thus, when a write operation in the pattern mode and a write operation in the data copy mode are successively performed, toggle of the flags may be prevented to reduce power consumption of the semiconductor device 3.

The flag pipe 340 may receive and latch the flags for controlling the pattern mode and the data copy mode to output delayed flags at a predetermined point in time. The flag pipe 340 does not shift the flags but controls a point in time when the delayed flags are generated. As a result, it may be possible to provide the pattern mode and the data copy mode with reducing or minimizing the power consumption and a layout area of the of the semiconductor device 3.

The pattern mode control circuit 360 may receive the delayed flags outputted from the flag pipe 340 to provide the pattern mode performing a write operation for the data pattern which is set based on the set signal CA. Because there is no need to receive the data DATA through a data pad in the pattern mode, it may be possible to reduce the power consumption of the semiconductor device 3.

The data copy control circuit 380 may receive the delayed flags outputted from the flag pipe 340 to provide the data copy mode copying the data DATA inputted through one data pad onto data paths connected to other data pads. In the data copy mode, the data DATA may be received through only one data pad to perform a write operation for the data paths connected to a plurality of data pads using a data copy operation. As a result, it may be possible to reduce the power consumption of the semiconductor device 3.

Figure 2:
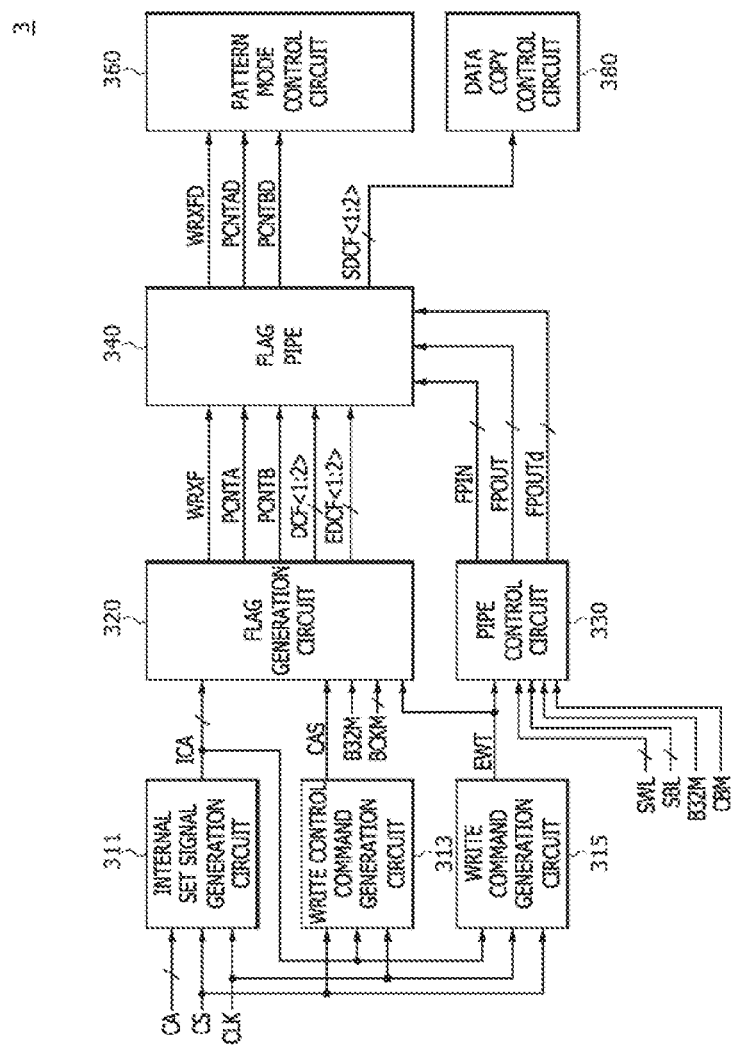
FIG. 2 is a block diagram illustrating a configuration of a semiconductor device included in the semiconductor system of FIG. 1.

FIG. 2 is a block diagram illustrating a configuration of the semiconductor device 3. As illustrated in FIG. 2, the semiconductor device 3 may include an internal set signal generation circuit 311, a write control command generation circuit 313, a write command generation circuit 315, the flag generation circuit 320, a pipe control circuit 330, the flag pipe 340, the pattern mode control circuit 360, and the data copy control circuit 380.

The internal set signal generation circuit 311 may generate an internal set signal ICA based on the set signal CA, a chip selection signal CS, and the clock signal CLK. The internal set signal generation circuit 311 may buffer the set signal CA in synchronization with the clock signal CLK to generate the internal set signal ICA while the chip selection signal CS having a predetermined level is inputted to the internal set signal generation circuit 311.

The write control command generation circuit 313 may generate a write control command CAS based on the internal set signal ICA, the chip selection signal CS, and the clock signal CLK. The write control command generation circuit 313 may be synchronized with the clock signal CLK to generate the write control command CAS while the chip selection signal CS having a predetermined level and the internal set signal ICA having a predetermined logic level combination are inputted to the write control command generation circuit 313. A logic level combination of bits included in the internal set signal ICA for generating the write control command CAS may be set to be different according to the embodiment.

The write command generation circuit 315 may generate a write command EWT based on the internal set signal ICA, the chip selection signal CS, and the clock signal CLK. The write command generation circuit 315 may be synchronized with the clock signal CLK to generate the write command EWT for performing a write operation while the chip selection signal CS having a predetermined level and the internal set signal ICA having a predetermined logic level combination are inputted to the write command generation circuit 315. A logic level combination of bits included in the internal set signal ICA for generating the write command EWT may be set to be different according to the embodiments.

The flag generation circuit 320 may generate a pattern mode flag WRXF, a first pattern control flag PCNTA, a second pattern control flag PCNTB, a data copy flag DCF<1:2>, and an enlargement data copy flag EDCF<1:2> based on the write control command CAS, the write command EWT, the internal set signal ICA, a burst mode signal B32M, and a bank clock mode signal BCKM. The burst mode signal B32M may have a logic level determined according to a burst length defined as the number of bits of data which are successively outputted for each write command. For example, the burst mode signal B32M may be set to have a logic "low" level when the burst length is set as '16' and may be set to have a logic "high" level when the burst length is set as '32.' The bank clock mode signal BCKM may have a logic level determined according to a bank mode and a clock mode. For example, the bank clock mode signal BCKM may be set to have a logic "low" level while a first clock mode is activated in a bank group mode and may be set to have a logic "high" level while a second clock mode is activated in an 8-bank mode or while the second clock mode is activated in a 16-bank mode.

The bank mode may include the bank group mode, the 8-bank mode, and the 16-bank mode. In the bank group mode, a column operation for one bank included in one bank group may be performed by a write command. The bank group may include a plurality of banks, each of which is comprised of a memory cell array, selected by a bank address. In the 8-bank mode, column operations for two banks respectively included in two different bank groups may be sequentially performed by a write command. For example, in the 8-bank mode, after a column operation for a bank included in a first bank group is performed, a column operation for a bank included in a second bank group may be performed. In the 16-bank mode, column operations for four banks respectively included in four different bank groups may be sequentially performed by a write command. For example, in the 16-bank mode, column operations for a bank included in a first bank group, a bank included in a second bank group, a bank included in a third bank group, and a bank included in a fourth bank group may be sequentially performed. The clock mode may include the first clock mode in which a frequency of a data input/output (I/O) clock signal (not shown) for input and output of data is set to be four times a frequency of the clock signal CLK and the second clock mode in which a frequency of the data I/O clock signal is set to be twice a frequency of the clock signal CLK.

The flag generation circuit 320 may generate the pattern mode flag WRXF, the first pattern control flag PCNTA, the second pattern control flag PCNTB, the data copy flag DCF<1:2>, and the enlargement data copy flag EDCF<1:2>, pulse widths of which are adjusted according to the burst length, the bank mode, and the clock mode. The pattern mode flag WRXF may be generated to activate the pattern mode for performing a write operation for a data pattern. The first pattern control flag PCNTA may be generated to set a data pattern which is written through a first data path. The second pattern control flag PCNTB may be generated to set a data pattern which is written through a second data path. The first data path and the second data path may be electrically connected to specific data pads. The data copy flag DCF<1:2> and the enlargement data copy flag EDCF<1:2> may be generated to copy the data inputted through the specific data pads onto a third data path connected to other data pads in the data copy mode. The third data path may be electrically connected to data pads. For example, when first to fourth data, each of which includes "N" bits, are inputted through the data pads, a first bit signal DCF<1> of the data copy flag DCF<1:2> may be generated to copy the first data inputted through the data pads onto the third data path, a second bit signal DCF<2> of the data copy flag DCF<1:2> may be generated to copy the second data inputted through the data pads onto the third data path, a first bit signal EDCF<1> of the enlargement data copy flag EDCF<1:2> may be generated to copy the third data inputted through the data pads onto the third data path, and a second bit signal EDCF<2> of the enlargement data copy flag EDCF<1:2> may be generated to copy the fourth data inputted through the data pads onto the third data path. The number "N" of bits included in each data may be set as a natural number. In the present embodiment, when 32-bit data are inputted through the data pads while the burst length is set as '32,' the number "N" may be set as '8.' Although the present embodiment is described in conjunction with a case for which the number "N" is set as '8' while the burst length is set as '32,' the burst length and the number "N" are not limited to the present embodiment.

The pipe control circuit 330 may generate a pipe input control signal FPIN, a pipe output control signal FPOUT, and a delayed pipe output control signal FPOUTd based on the write command EWT, a latency set signal SWL, a burst set signal SBL, the burst mode signal B32M, and a bubble mode signal CBM. The latency set signal SWL may include bits whose signals have a logic level combination corresponding to a write latency. The burst set signal SBL may include bits whose signals have a logic level combination corresponding to the burst length. A logic level of the bubble mode signal CBM may be determined according to whether a bubble period is included when a column operation for a bank is performed by a write command. The bubble period may be provided to perform a column operation for a bank during a period between column operations for other banks when a write operation is performed while the bank mode is set as the bank group mode and the burst length is set as '32.'

The pipe control circuit 330 may generate the pipe input control signal FPIN when the write command EWT is generated. The pipe control circuit 330 may generate the pipe output control signal FPOUT when a period set by the write latency and the burst length elapses from a point in time when the write command EWT is generated. The pipe control circuit 330 may generate the delayed pipe output control signal FPOUTd when a period determined according to the write latency, the burst length, and presence/absence of the bubble period elapses from a point in time when the write command EWT is generated while the burst length is set as '32.'

The flag pipe 340 may latch the pattern mode flag WRXF, the first pattern control flag PCNTA, the second pattern control flag PCNTB, the data copy flag DCF<1:2>, and the enlargement data copy flag EDCF<1:2> based on the pipe input control signal FPIN. The flag pipe 340 may output a delayed pattern mode flag WRXFD, a first delayed pattern control flag PCNTAD, a second delayed pattern control flag PCNTBD, and a synthesis data copy flag SDCF<1:2> based on the pipe output control signal FPOUT and the delayed pipe output control signal FPOUTd.

The flag pipe 340 may latch the pattern mode flag WRXF based on the pipe input control signal FPIN. The flag pipe 340 may output the latched flag of the pattern mode flag WRXF as the delayed pattern mode flag WRXFD based on the pipe output control signal FPOUT when the burst length is '16.' The flag pipe 340 may output the latched flag of the pattern mode flag WRXF as the delayed pattern mode flag WRXFD based on the delayed pipe output control signal FPOUTd when the burst length is '32.'

The flag pipe 340 may latch the first pattern control flag PCNTA based on the pipe input control signal FPIN. The flag pipe 340 may output the latched flag of the first pattern control flag PCNTA as the first delayed pattern control flag PCNTAD based on the pipe output control signal FPOUT when the burst length is '16.' The flag pipe 340 may output the latched flag of the first pattern control flag PCNTA as the first delayed pattern control flag PCNTAD based on the delayed pipe output control signal FPOUTd when the burst length is '32.'

The flag pipe 340 may latch the second pattern control flag PCNTB based on the pipe input control signal FPIN. The flag pipe 340 may output the latched flag of the second pattern control flag PCNTB as the second delayed pattern control flag PCNTBD based on the pipe output control signal FPOUT when the burst length is '16.' The flag pipe 340 may output the latched flag of the second pattern control flag PCNTB as the second delayed pattern control flag PCNTBD based on the delayed pipe output control signal FPOUTd when the burst length is '32.'

While the burst length is set to be '16,' the flag pipe 340 may latch the data copy flag DCF<1:2> based on the pipe input control signal FPIN and may output the latched flag of the data copy flag DCF<1:2> as the synthesis data copy flag SDCF<1:2> based on the pipe output control signal FPOUT. While the burst length is set to be '32,' the flag pipe 340 may latch the enlargement data copy flag EDCF<1:2> based on the pipe input control signal FPIN and may output the latched flag of the enlargement data copy flag EDCF<1:2> as the synthesis data copy flag SDCF<1:2> based on the delayed pipe output control signal FPOUTd, The pattern mode control circuit 360 may provide the pattern mode performing a write operation of the data pattern based on the delayed pattern mode flag WRXFD, the first delayed pattern control flag PCNTAD, and the second delayed pattern control flag PCNTBD. The pattern mode control circuit 360 may activate the pattern mode for a write operation of the data pattern based on the delayed pattern mode flag WRXFD. The pattern mode control circuit 360 may set the data pattern, which is written through the first data path in the pattern mode, based on the first delayed pattern control flag PCNTAD. The pattern mode control circuit 360 may set the data pattern, which is written through the second data path in the pattern mode, based on the second delayed pattern control flag PCNTBD.

The data copy control circuit 380 may provide the data copy mode that copies data inputted through a data pad onto data paths connected to other data pads based on the synthesis data copy flag SDCF<1:2>.

FIG. 3 is a table illustrating an operation that generates various flags for controlling the pattern mode and the data copy mode according to an internal set signal. As illustrated in FIG. 3, the write control command CAS may be generated when the chip selection signal CS has a logic "high(H)" level, first and second bit signals ICA<1:2> of the internal set signal ICA are set to have a logic "low(L)" level in synchronization with a rising edge of the clock signal CLK, and third and fourth bit signals ICA<3:4> of the internal set signal ICA are set to have a logic "high(H)" level in synchronization with a rising edge of the clock signal CLK. A first bit signal DCF<1> of the data copy flag DCF<1:2> may be generated by the first bit signal ICA<1> of the internal set signal ICA in synchronization with a falling edge of the clock signal CLK while the write control command CAS is generated. A second bit signal DCF<2> of the data copy flag DCF<1:2> may be generated by the second bit signal ICA<2> of the internal set signal ICA in synchronization with a falling edge of the clock signal CLK while the write control command CAS is generated. A first bit signal EDCF<1> of the enlargement data copy flag EDCF<1:2> may be generated by the third bit signal ICA<3> of the internal set signal ICA in synchronization with a falling edge of the clock signal CLK while the write control command CAS is generated. A second bit signal EDCF<2> of the enlargement data copy flag EDCF<1:2> may be generated by the fourth bit signal ICA<4> of the internal set signal ICA in synchronization with a falling edge of the clock signal CLK while the write control command CAS is generated. The pattern mode flag WRXF may be generated by a fifth bit signal ICA<5> of the internal set signal ICA in synchronization with a falling edge of the clock signal CLK while the write control command CAS is generated. The first pattern control flag PCNTA may be generated by a sixth bit signal ICA<6> of the internal set signal ICA in synchronization with a falling edge of the clock signal CLK while the write control command CAS is generated. The second pattern control flag PCNTB may be generated by a seventh bit signal ICA<7> of the internal set signal ICA in synchronization with a falling edge of the clock signal CLK while the write control command CAS is generated.

Figure 4:
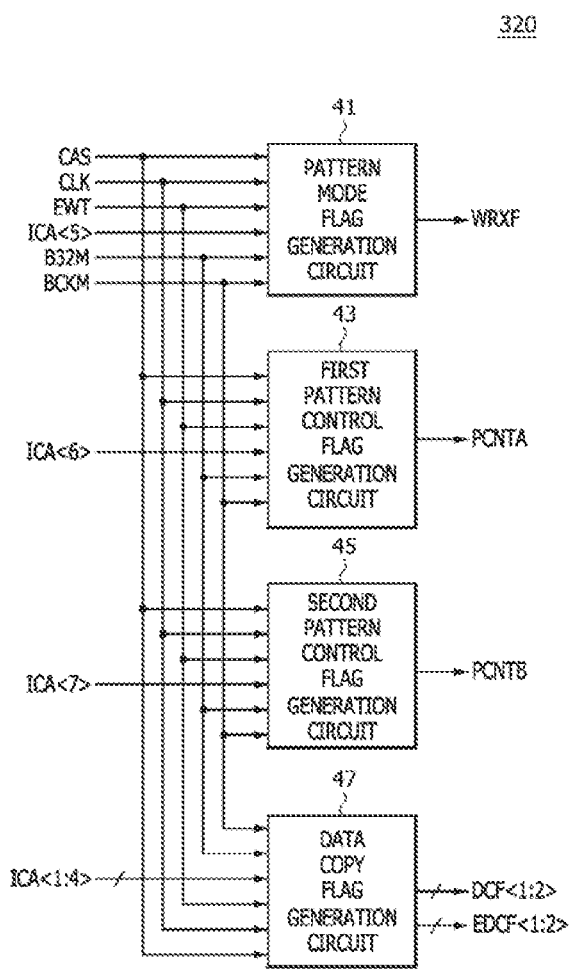
FIG. 4 is a block diagram illustrating a configuration of a flag generation circuit included in the semiconductor device of FIG. 2.

FIG. 4 is a block diagram illustrating a configuration of the flag generation circuit 320 included in the semiconductor device 3. As illustrated in FIG. 4, the flag generation circuit 320 may include a pattern mode flag generation circuit 41, a first pattern control flag generation circuit 43, a second pattern control flag generation circuit 45, and a data copy flag generation circuit 47.

The pattern mode flag generation circuit 41 may generate the pattern mode flag WRXF based on the write control command CAS, the clock signal CLK, the write command EWT, the fifth bit signal ICA<5> of the internal set signal ICA, the burst mode signal B32M, and the bank clock mode signal BCKM.

The pattern mode flag generation circuit 41 may generate the pattern mode flag WRXF having a first pulse width when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '16.' The first pulse width may be set to correspond to two cycles of the clock signal CLK. The pattern mode flag generation circuit 41 may generate the pattern mode flag WRXF having a second pulse width when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The second pulse width may be set to correspond to four cycles of the clock signal CLK. The pattern mode flag generation circuit 41 may generate the pattern mode flag WRXF having a third pulse width when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode. The third pulse width may be set to correspond to six cycles of the clock signal CLK.

The first pattern control flag generation circuit 43 may generate the first pattern control flag PCNTA based on the write control command CAS, the clock signal CLK, the write command EWT, the sixth bit signal ICA<6> of the internal set signal ICA, the burst mode signal B32M, and the bank clock mode signal BCKM. The first pattern control flag generation circuit 43 may generate the first pattern control flag PCNTA having the first pulse width when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '16.' The first pattern control flag generation circuit 43 may generate the first pattern control flag PCNTA having the second pulse width when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The first pattern control flag generation circuit 43 may generate the first pattern control flag PCNTA having the third pulse width when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bit bank mode.

The second pattern control flag generation circuit 45 may generate the second pattern control flag PCNTB based on the write control command CAS, the clock signal CLK, the write command EWT, the seventh bit signal ICA<7> of the internal set signal ICA, the burst mode signal B32M, and the bank clock mode signal BCKM. The second pattern control flag generation circuit 45 may generate the second pattern control flag PCNTB having the first pulse width when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '16.' The second pattern control flag generation circuit 45 may generate the second pattern control flag PCNTB having the second pulse width when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The second pattern control flag generation circuit 45 may generate the second pattern control flag PCNTB having the third pulse width when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bit bank mode.

The data copy flag generation circuit 47 may generate the data copy flag DCF<1:2> and the enlargement data copy flag EDCF<1:2> based on the write control command CAS, the clock signal CLK, the write command EWT, the first to fourth bit signals ICA<1:4> of the internal set signal ICA, the burst mode signal B32M, and the bank clock mode signal BCKM. The data copy flag generation circuit 47 may generate a first bit signal DCF<1> of the data copy flag DCF<1:2> having the first pulse width when the write control command CAS is generated, the first bit signal ICA<1> of the internal set signal ICA having a predetermined level is inputted in synchronization with a falling edge of the clock signal CLK, and the write command EWT is generated to perform a write operation while the burst length is set to be '16.' The data copy flag generation circuit 47 may generate a second bit signal DCF<2> of the data copy flag DCF<1:2> having the first pulse width when the write control command CAS is generated, the first bit signal ICA<1> of the internal set signal ICA having a predetermined level is inputted in synchronization with a falling edge of the clock signal CLK, and the write command EWT is generated to perform a write operation while the burst length is set to be '16.'

The data copy flag generation circuit 47 may generate the first bit signal EDCF<1> of the enlargement data copy flag EDCF<1:2> having the second pulse width when the write control command CAS is generated, the third bit signal ICA<3> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The data copy flag generation circuit 47 may generate the first bit signal EDCF<1> of the enlargement data copy flag EDCF<1:2> having the third pulse width when the write control command CAS is generated, the third bit signal ICA<3> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode.

The data copy flag generation circuit 47 may generate the second bit signal EDCF<2> of the enlargement data copy flag EDCF<1:2> having the second pulse width when the write control command CAS is generated, the fourth bit signal ICA<4> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The data copy flag generation circuit 47 may generate the second bit signal EDCF<2> of the enlargement data copy flag EDCF<1:2> having the third pulse width when the write control command CAS is generated, the fourth bit signal ICA<4> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode.

Figure 5:
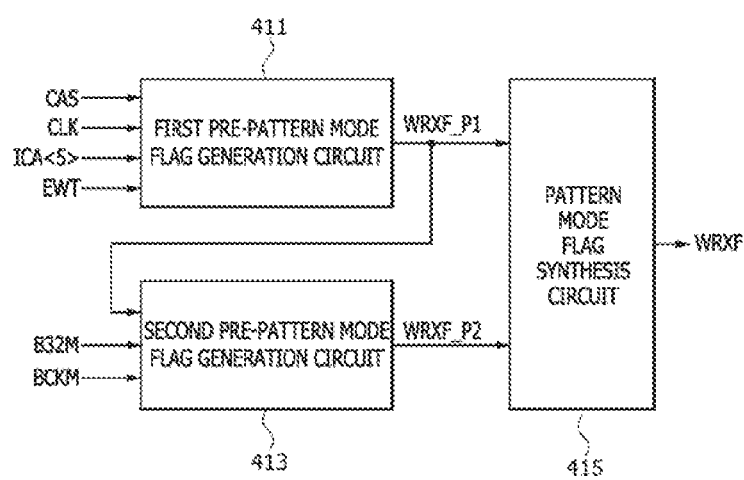
FIG. 5 is a block diagram illustrating a configuration of a pattern mode flag generation circuit included in the flag generation circuit of FIG. 4.

FIG. 5 is a block diagram illustrating a configuration of the pattern mode flag generation circuit 41. As illustrated in FIG. 5, the pattern mode flag generation circuit 41 may include a first pre-pattern mode flag generation circuit 411, a second pre-pattern mode flag generation circuit 413, and a pattern mode flag synthesis circuit 415.

The first pre-pattern mode flag generation circuit 411 may generate a first pre-pattern mode flag WRXF_P1 based on the write control command CAS, the clock signal CLK, the write command EWT, and the fifth bit signal ICA<5> of the internal set signal ICA. The first pre-pattern mode flag generation circuit 411 may generate the first pre-pattern mode flag WRXF_P1 for two cycles of the clock signal CLK when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '16.' A time period that the first pre-pattern mode flag WRXF_P1 is generated may be set to be different according to the embodiments.

The second pre-pattern mode flag generation circuit 413 may generate a second pre-pattern mode flag WRXF_P2 based on the burst mode signal B32M and the bank dock mode signal BCKM.

The second pre-pattern mode flag generation circuit 413 may generate the second pre-pattern mode flag WRXF_P2 for two cycles of the clock signal CLK after the first pre-pattern mode flag WRXF_P1 is generated when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The second pre-pattern mode flag generation circuit 413 may generate the second pre-pattern mode flag WRXF_P2 for four cycles of the clock signal CLK after the first pre-pattern mode flag WRXF_P1 is generated when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode. A time period that the second pre-pattern mode flag WRXF_P2 is generated may be set to be different according to the embodiments.

The pattern mode flag synthesis circuit 415 may synthesize the first pre-pattern mode flag WRXF_P1 and the second pre-pattern mode flag WRXF_P2 to generate the pattern mode flag WRXF. The pattern mode flag synthesis circuit 415 may generate the pattern mode flag WRXF when the first pre-pattern mode flag WRXF_P1 or the second pre-pattern mode flag WRXF_P2 is generated. The pattern mode flag synthesis circuit 415 may generate the pattern mode flag WRXF for two cycles of the clock signal CLK based on the first pre-pattern mode flag WRXF_P1 when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '16.' The pattern mode flag synthesis circuit 415 may generate the pattern mode flag WRXF for four cycles of the clock signal CLK based on the first pre-pattern mode flag WRXF_P1 and the second pre-pattern mode flag WRXF_P2 when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The pattern mode flag synthesis circuit 415 may generate the pattern mode flag WRXF for six cycles of the clock signal CLK based on the first pre-pattern mode flag WRXF_P1 and the second pre-pattern mode flag WRXF_P2 when the write control command CAS is generated, the fifth bit signal ICA<5> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode.

Figure 6:
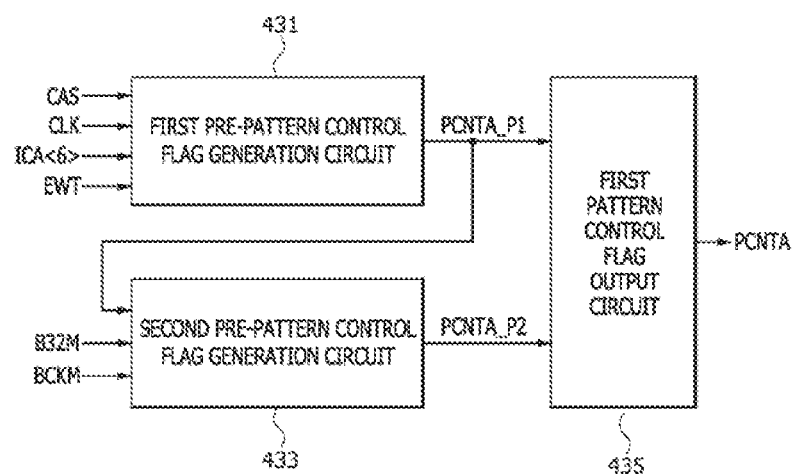
FIG. 6 is a block diagram illustrating a configuration of a first pattern control flag generation circuit included in the flag generation circuit of FIG. 4.

FIG. 6 is a block diagram illustrating a configuration of the first pattern control flag generation circuit 43. As illustrated in FIG. 6, the first pattern control flag generation circuit 43 may include a first pre-pattern control flag generation circuit 431, a second pre-pattern control flag generation circuit 433, and a first pattern control flag output circuit 435.

The first pre-pattern control flag generation circuit 431 may generate a first pre-pattern control flag PCNTA_P1 based on the write control command CAS, the clock signal CLK, the write command EWT, and the sixth bit signal ICA<6> of the internal set signal ICA. The first pre-pattern control flag generation circuit 431 may generate the first pre-pattern control flag PCNTA_P1 for two cycles of the clock signal CLK when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '16.' A time period that the first pre-pattern control flag PCNTA_P1 is generated may be set to be different according to the embodiments.

The second pre-pattern control flag generation circuit 433 may generate a second pre-pattern control flag PCNTA_P2 based on the burst mode signal B32M and the bank clock mode signal BCKM, The second pre-pattern control flag generation circuit 433 may generate the second pre-pattern control flag PCNTA_P2 for two cycles of the clock signal CLK after the first pre-pattern control flag PCNTA_P1 is generated when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The second pre-pattern control flag generation circuit 433 may generate the second pre-pattern control flag PCNTA_P2 for four cycles of the clock signal CLK after the first pre-pattern control flag PCNTA_P1 is generated when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode. A time period that the second pre-pattern control flag PCNTA_P2 is generated may be set to be different according to the embodiments.

The first pattern control flag output circuit 435 may synthesize the first pre-pattern control flag PCNTA_P1 and the second pre-pattern control flag PCNTA_P2 to generate the first pattern control flag PCNTA. The first pattern control flag output circuit 435 may generate the first pattern control flag PCNTA when the first pre-pattern control flag PCNTA_P1 or the second pre-pattern control flag PCNTA_P2 is generated. The first pattern control flag output circuit 435 may generate the first pattern control flag PCNTA for two cycles of the clock signal CLK based on the first pre-pattern control flag PCNTA_P1 when the write control command CAS is generated, the sixth bit signal ICA<6> of the internal set signal ICA having a predetermined level is inputted in synchronization with a falling edge of the clock signal CLK, and the write command EMT is generated to perform a write operation while the burst length is set to be '16.' The first pattern control flag output circuit 435 may generate the first pattern control flag PCNTA for four cycles of the clock signal CLK based on the first pre-pattern control flag PCNTA_P1 and the second pre-pattern control flag PCNTA_P2 when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The first pattern control flag output circuit 435 may generate the first pattern control flag PCNTA for six cycles of the clock signal CLK based on the first pre-pattern control flag PCNTA_P1 and the second pre-pattern control flag PCNTA_P2 when the write control command CAS is generated, the sixth bit signal ICA<6> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode.

Figure 7:
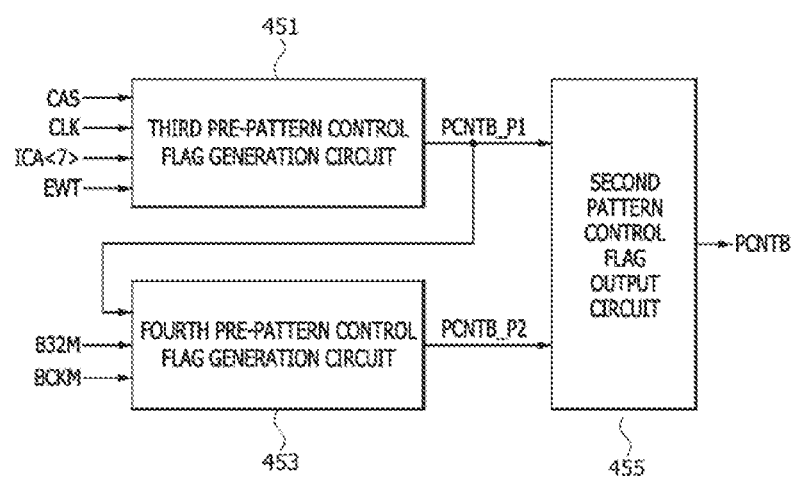
FIG. 7 is a block diagram illustrating a configuration of a second pattern control flag generation circuit included in the flag generation circuit of FIG. 4.

FIG. 7 is a block diagram illustrating a configuration of the second pattern control flag generation circuit 45. As illustrated in FIG. 7, the second pattern control flag generation circuit 45 may include a third pre-pattern control flag generation circuit 451, a fourth pre-pattern control flag generation circuit 453, and a second pattern control flag output circuit 455.

The third pre-pattern control flag generation circuit 451 may generate a third pre-pattern control flag PCNTB_P1 based on the write control command CAS, the clock signal CLK, the write command EWT, and the seventh bit signal ICA<7> of the internal set signal ICA. The third pre-pattern control flag generation circuit 451 may generate the third pre-pattern control flag PCNTB_P1 for two cycles of the clock signal CLK when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '16.' A time period that the third pre-pattern control flag PCNTB_P1 is generated may be set to be different according to the embodiments.

The fourth pre-pattern control flag generation circuit 453 may generate a fourth pre-pattern control flag PCNTB_P2 based on the burst mode signal B32M and the bank clock mode signal BCKM. The fourth pre-pattern control flag generation circuit 453 may generate the fourth pre-pattern control flag PCNTB_P2 for two cycles of the clock signal CLK after the third pre-pattern control flag PCNTB_P1 is generated when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The fourth pre-pattern control flag generation circuit 453 may generate the fourth pre-pattern control flag PCNTB_P2 for four cycles of the clock signal CLK after the third pre-pattern control flag PCNTB_P1 is generated when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode. A time period that the fourth pre-pattern control flag PCNTB_P2 is generated may be set to be different according to the embodiments.

The second pattern control flag output circuit 455 may synthesize the third pre-pattern control flag PCNTB_P1 and the fourth pre-pattern control flag PCNTB_P2 to generate the second pattern control flag PCNTB. The second pattern control flag output circuit 455 may generate the second pattern control flag PCNTB when the third pre-pattern control flag PCNTB_P1 or the fourth pre-pattern control flag PCNTB_P2 is generated. The second pattern control flag output circuit 455 may generate the second pattern control flag PCNTB for two cycles of the clock signal CLK based on the third pre-pattern control flag PCNTB_P1 when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '16.' The second pattern control flag output circuit 455 may generate the second pattern control flag PCNTB for four cycles of the clock signal CLK based on the third pre-pattern control flag PCNTB_P1 and the fourth pre-pattern control flag PCNTB_P2 when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The second pattern control flag output circuit 455 may generate the second pattern control flag PCNTB for six cycles of the clock signal CLK based on the third pre-pattern control flag PCNTB_P1 and the fourth pre-pattern control flag PCNTB_P2 when the write control command CAS is generated, the seventh bit signal ICA<7> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode.

Figure 8:
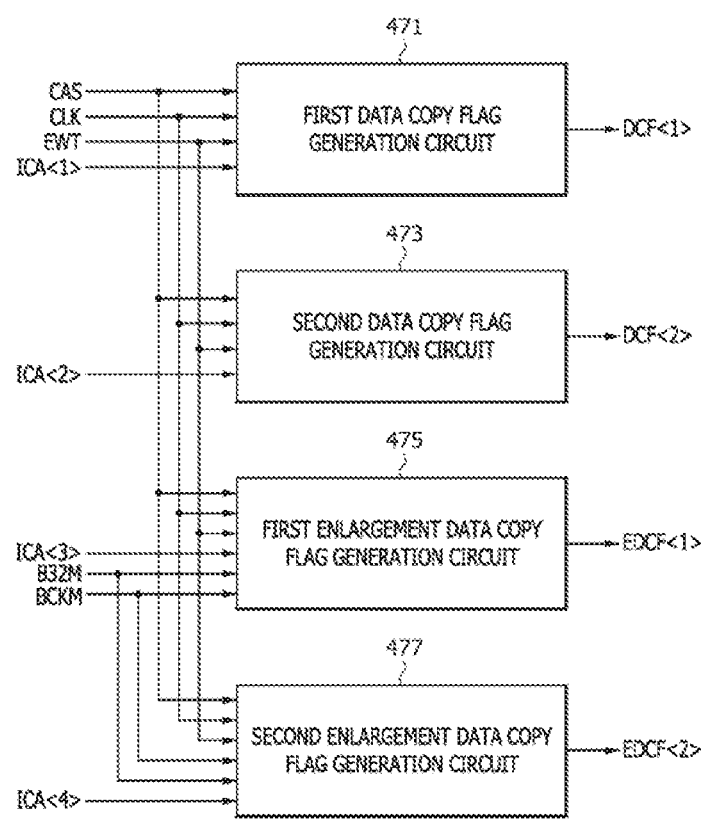
FIG. 8 is a block diagram illustrating a configuration of a data copy flag generation circuit included in the flag generation circuit of FIG. 4.

FIG. 8 is a block diagram illustrating a configuration of the data copy flag generation circuit 47. As illustrated in FIG. 8, the data copy flag generation circuit 47 may include a first data copy flag generation circuit 471, a second data copy flag generation circuit 473, a first enlargement data copy flag generation circuit 475, and a second enlargement data copy flag generation circuit 477.

The first data copy flag generation circuit 471 may generate a first bit signal DCF<1> of the data copy flag DCF<1:2> based on the write control command CAS, the clock signal CLK, the write command EWT, and the first bit signal ICA<1> of the internal set signal ICA. The first data copy flag generation circuit 471 may generate the first bit signal DCF<1> of the data copy flag DCF<1:2> for two cycles of the clock signal CLK when the write control command CAS is generated, the first bit signal ICA<1> of the internal set signal ICA having a predetermined level is inputted in synchronization with a falling edge of the clock signal CLK, and the write command EWT is generated to perform a write operation while the burst length is set to be '16.' A time period that the first bit signal DCF<1> of the data copy flag DCF<1:2> is generated may be set to be different according to the embodiments.

The second data copy flag generation circuit 473 may generate a second bit signal DCF<2> of the data copy flag DCF<1:2> based on the write control command CAS, the clock signal CLK, the write command EWT, and the second bit signal ICA<2> of the internal set signal ICA. The second data copy flag generation circuit 473 may generate the second bit signal DCF<2> of the data copy flag DCF<1:2> for two cycles of the clock signal CLK when the write control command CAS is generated, the second bit signal ICA<2> of the internal set signal ICA having a predetermined level is inputted in synchronization with a falling edge of the clock signal CLK, and the write command EWT is generated to perform a write operation while the burst length is set to be '16.' A time period that the second bit signal DCF<2> of the data copy flag DCF<1:2> is generated may be set to be different according to the embodiments.

The first enlargement data copy flag generation circuit 475 may generate a first bit signal EDCF<1> of the enlargement data copy flag EDCF<1:2> based on the write control command CAS, the clock signal CLK, the write command EWT, the third bit signal ICA<3> of the internal set signal ICA, the burst mode signal B32M, and the bank clock mode signal BCKM. The first enlargement data copy flag generation circuit 475 may generate the first bit signal EDCF<1> of the enlargement data copy flag EDCF<1:2> for four cycles of the clock signal CLK when the write control command CAS is generated, the third bit signal ICA<3> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The first enlargement data copy flag generation circuit 475 may generate the first bit signal EDCF<1> of the enlargement data copy flag EDCF<1:2> for six cycles of the clock signal CLK when the write control command CAS is generated, the third bit signal ICA<3> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode. A time period that the first bit signal EDCF<1> of the enlargement data copy flag EDCF<1:2> is generated may be set to be different according to the embodiments.

The second enlargement data copy flag generation circuit 477 may generate a second bit signal EDCF<2> of the enlargement data copy flag EDCF<1:2> based on the write control command CAS, the clock signal CLK, the write command EWT, the fourth bit signal ICA<4> of the internal set signal ICA, the burst mode signal B32M, and the bank clock mode signal BCKM. The second enlargement data copy flag generation circuit 477 may generate the second bit signal EDCF<2> of the enlargement data copy flag EDCF<1:2> for four cycles of the clock signal CLK when the write control command CAS is generated, the fourth bit signal ICA<4> of the internal set signal ICA having a predetermined level is inputted in synchronization with a falling edge of the clock signal CLK, and the write command EWT is generated to perform a write operation while the burst length is set to be '32' and the first clock mode is activated in the bank group mode. The second enlargement data copy flag generation circuit 477 may generate the second bit signal EDCF<2> of the enlargement data copy flag EDCF<1:2> for six cycles of the clock signal CLK when the write control command CAS is generated, the fourth bit signal ICA<4> of the internal set signal ICA having a predetermined level is inputted in synchronization with a falling edge of the clock signal CLK, and the write command EWT is generated to perform a write operation while the burst length is set to be '32' and the second clock mode is activated in the 8-bank mode or the 16-bank mode. A time period that the second bit signal EDCF<2> of the enlargement data copy flag EDCF<1:2> is generated may be set to be different according to the embodiments.

Figure 9:
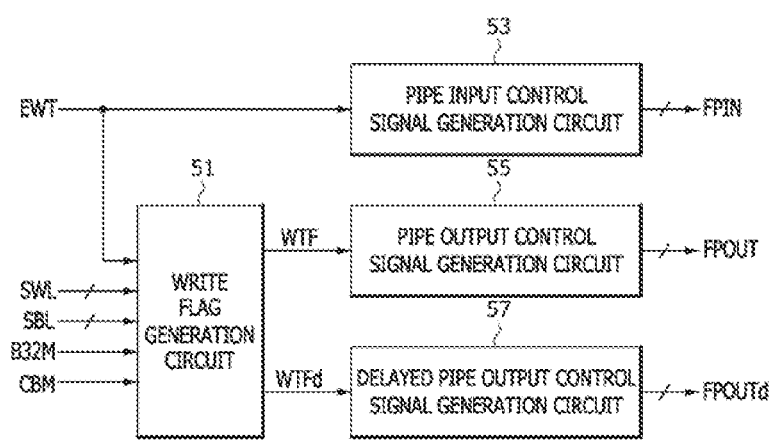
FIG. 9 is a block diagram illustrating a configuration of a pipe control circuit included in the semiconductor device of FIG. 2.

FIG. 9 is a block diagram illustrating a configuration of the pipe control circuit 330. As illustrated in FIG. 9, the pipe control circuit 330 may include a write flag generation circuit 51, a pipe input control signal generation circuit 53, a pipe output control signal generation circuit 55, and a delayed pipe output control signal generation circuit 57.

The write flag generation circuit 51 may generate a write flag WTF and a delayed write flag WTFd based on the latency set signal SWL, the burst set signal SBL, the burst mode signal B32M, and the bubble mode signal CBM. The write flag generation circuit 51 may generate the write flag WTF when a period set by the write latency and the burst length elapses from a point in time when the write command EWT is generated. The write flag generation circuit 51 may generate the delayed write flag WTFd by delaying the write flag WTF by a period determined according to presence/absence of the bubble period while the burst length is set to be '32.'

The pipe input control signal generation circuit 53 may generate the pipe input control signal FPIN based on the write command EWT. The pipe input control signal generation circuit 53 may generate the pipe input control signal FPIN including bit signals whose logic level combination varies whenever the write command EWT is inputted to the pipe input control signal generation circuit 53. The pipe input control signal generation circuit 53 may include a counter (not shown) counting the write command EWT and may adjust a logic level combination of bit signals included in the pipe input control signal FPIN.

The pipe output control signal generation circuit 55 may generate the pipe output control signal FPOUT based on the write flag WTF. The pipe output control signal generation circuit 55 may generate the pipe output control signal FPOUT including bit signals whose logic level combination varies whenever the write flag WTF is inputted to the pipe output control signal generation circuit 55. The pipe output control signal generation circuit 55 may include a counter (not shown) counting the write flag WTF and may adjust a logic level combination of bit signals included in the pipe output control signal FPOUT.

The delayed pipe output control signal generation circuit 57 may generate the delayed pipe output control signal FPOUTd based on the delayed write flag WTFd. The delayed pipe output control signal generation circuit 57 may generate the delayed pipe output control signal FPOUTd including bit signals whose logic level combination varies whenever the delayed write flag WTFd is inputted to the delayed pipe output control signal generation circuit 57. The delayed pipe output control signal generation circuit 57 may include a counter (not shown) counting the delayed write flag WTFd and may adjust a logic level combination of bit signals included in the delayed pipe output control signal FPOUTd.

Figure 10:
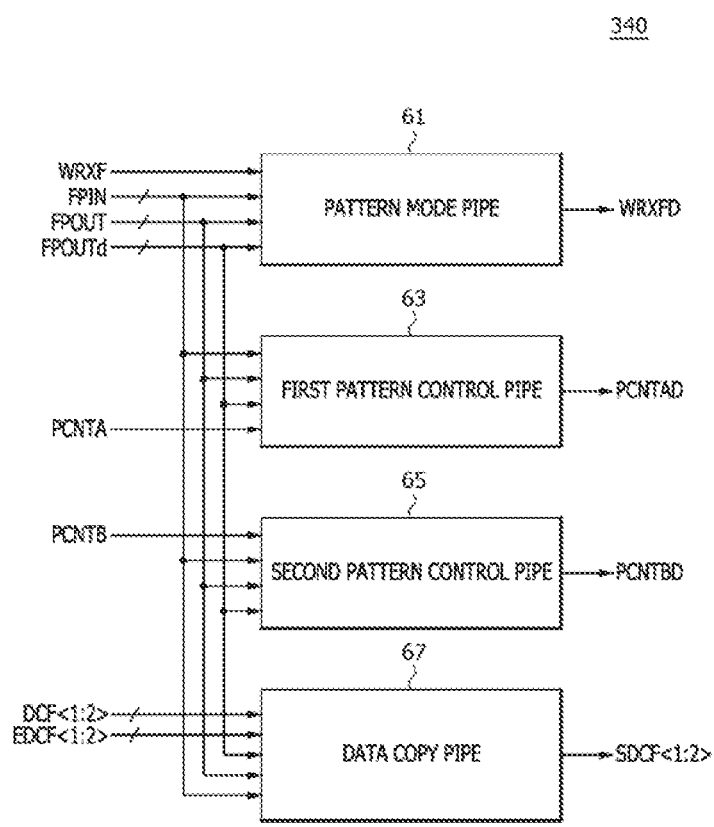
FIG. 10 is a block diagram illustrating a configuration of a flag pipe included in the semiconductor device of FIG. 2.

FIG. 10 is a block diagram illustrating a configuration of the flag pipe 340. As illustrated in FIG. 10, the flag pipe 340 may include a pattern mode pipe 61, a first pattern control pipe 63, a second pattern control pipe 65, and a data copy pipe 67.

The pattern mode pipe 61 may generate the delayed pattern mode flag WRXFD based on the pattern mode flag WRXF, the pipe input control signal FPIN, the pipe output control signal FPOUT, and the delayed pipe output control signal FPOUTd. The pattern mode pipe 61 may latch the pattern mode flag WRXF based on the pipe input control signal FPIN. The pattern mode pipe 61 may output the latched flag of the pattern mode flag WRXF as the delayed pattern mode flag WRXFD based on the pipe output control signal FPOUT when the burst length is '16.' The pattern mode pipe 61 may output the latched flag of the pattern mode flag WRXF as the delayed pattern mode flag WRXFD based on the delayed pipe output control signal FPOUTd when the burst length is '32.'

The first pattern control pipe 63 may generate the first delayed pattern control flag PCNTAD based on the first pattern control flag PCNTA, the pipe input control signal FPIN, the pipe output control signal FPOUT, and the delayed pipe output control signal FPOUTd. The first pattern control pipe 63 may latch the first pattern control flag PCNTA based on the pipe input control signal FPIN. The first pattern control pipe 63 may output the latched flag of the first pattern control flag PCNTA as the first delayed pattern control flag PCNTAD based on the pipe output control signal FPOUT when the burst length is '16.' The first pattern control pipe 63 may output the latched flag of the first pattern control flag PCNTA as the first delayed pattern control flag PCNTAD based on the delayed pipe output control signal FPOUTd when the burst length is '32.'

The second pattern control pipe 65 may generate the second delayed pattern control flag PCNTBD based on the second pattern control flag PCNTB, the pipe input control signal FPIN, the pipe output control signal FPOUT, and the delayed pipe output control signal FPOUTd. The second pattern control pipe 65 may latch the second pattern control flag PCNTB based on the pipe input control signal FPIN. The second pattern control pipe 65 may output the latched flag of the second pattern control flag PCNTB as the second delayed pattern control flag PCNTBD based on the pipe output control signal FPOUT when the burst length is '16.' The second pattern control pipe 65 may output the latched flag of the second pattern control flag PCNTB as the second delayed pattern control flag PCNTBD based on the delayed pipe output control signal FPOUTd when the burst length is '32.'

The data copy pipe 67 may generate the synthesis data copy flag SDCF<1:2> based on the data copy flag DCF<1:2>, the enlargement data copy flag EDCF<1:2>, the pipe input control signal FPIN, the pipe output control signal FPOUT, and the delayed pipe output control signal FPOUTd. While the burst length is set as '16,' the data copy pipe 67 may latch the data copy flag DCF<1:2> based on the pipe input control signal FPIN and may output the latched flag of the data copy flag DCF<1:2> as the synthesis data copy flag SDCF<1:2> based on the pipe output control signal FPOUT. While the burst length is set as '32,' the data copy pipe 67 may latch the enlargement data copy flag EDCF<1:2> based on the pipe input control signal FPIN and may output the latched flag of the enlargement data copy flag EDCF<1:2> as the synthesis data copy flag SDCF<1:2> based on the delayed pipe output control signal FPOUTd.

Figure 11:
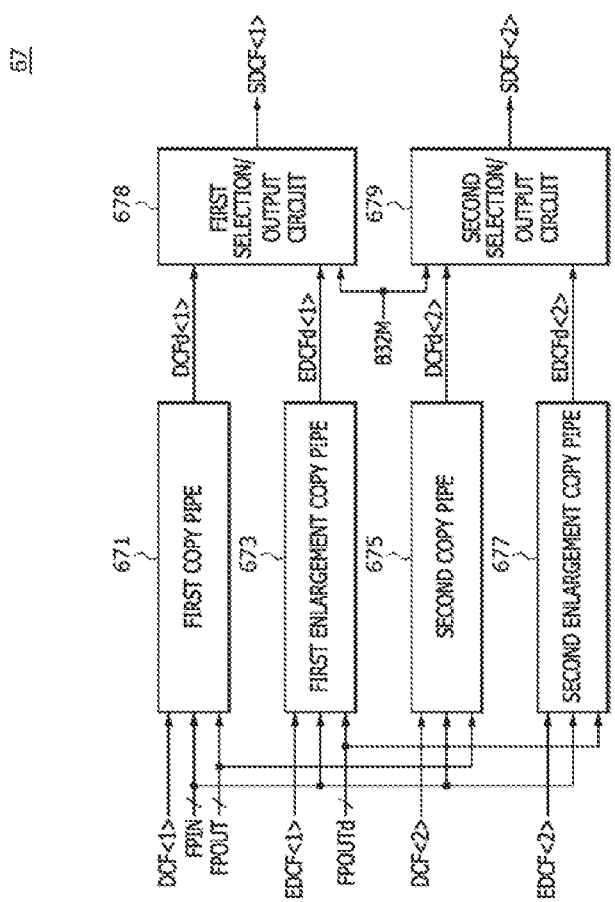
FIG. 11 is a block diagram illustrating a configuration of a data copy pipe included in the flag pipe of FIG. 10.

FIG. 11 is a block diagram illustrating a configuration of the data copy pipe 67. As illustrated in FIG. 11, the data copy pipe 67 may include a first copy pipe 671, a first enlargement copy pipe 673, a second copy pipe 675, a second enlargement copy pipe 677, a first selection/output circuit 678, and a second selection/output circuit 679.

The first copy pipe 671 may generate a first bit signal DCFd<1> of a delayed data copy flag DCFd<1:2> based on the first bit signal DCF<1> of the data copy flag DCF<1:2>, the pipe input control signal FPIN, and the pipe output control signal FPOUT. The first copy pipe 671 may latch the first bit signal DCF<1> of the data copy flag DCF<1:2> based on the pipe input control signal FPIN. The first copy pipe 671 may output the latched signal of the first bit signal DCF<1> of the data copy flag DCF<1:2> as the first bit signal DCFd<1> of the delayed data copy flag DCFd<1:2> based on the pipe output control signal FPOUT.

The first enlargement copy pipe 673 may generate a first bit signal EDCFd<1> of a delayed enlargement data copy flag EDCFd<1:2> based on the first bit signal EDCF<1> of the enlargement data copy flag EDCF<1:2>, the pipe input control signal FPIN, and the delayed pipe output control signal FPOUTd. The first enlargement copy pipe 673 may latch the first bit signal EDCF<1> of the enlargement data copy flag EDCF<1:2> based on the pipe input control signal FPIN. The first enlargement copy pipe 673 may output the latched signal of the first bit signal EDCF<1> of the enlargement data copy flag EDCF<1:2> as the first bit signal EDCFd<1> of the delayed enlargement data copy flag EDCFd<1:2> based on the delayed pipe output control signal FPOUTd.

The second copy pipe 675 may generate a second bit signal DCFd<2> of the delayed data copy flag DCFd<1:2> based on the second bit signal DCF<2> of the data copy flag DCF<1:2>, the pipe input control signal FPIN, and the pipe output control signal FPOUT. The second copy pipe 675 may latch the second bit signal DCF<2> of the data copy flag DCF<1:2> based on the pipe input control signal FPIN. The second copy pipe 671 may output the latched signal of the second bit signal DCF<2> of the data copy flag DCF<1:2> as the second bit signal DCFd<2> of the delayed data copy flag DCFd<1:2> based on the pipe output control signal FPOUT.

The second enlargement copy pipe 677 may generate a second bit signal EDCFd<2> of the delayed enlargement data copy flag EDCFd<1:2> based on the second bit signal EDCF<2> of the enlargement data copy flag EDCF<1:2>, the pipe input control signal FPIN, and the delayed pipe output control signal FPOUTd. The second enlargement copy pipe 677 may latch the second bit signal EDCF<2> of the enlargement data copy flag EDCF<1:2> based on the pipe input control signal FPIN. The second enlargement copy pipe 677 may output the latched signal of the second bit signal EDCF<2> of the enlargement data copy flag EDCF<1:2> as the second bit signal EDCFd<2> of the delayed enlargement data copy flag EDCFd<1:2> based on the delayed pipe output control signal FPOUTd.

The first selection/output circuit 678 may generate a first bit signal SDCF<1> of the synthesis data copy flag SDCF<1:2> based on the burst mode signal B32M, the first bit signal DCFd<1> of the delayed data copy flag DCFd<1:2>, and the first bit signal EDCFd<1> of the delayed enlargement data copy flag EDCFd<1:2>. The first selection/output circuit 678 may select and output the first bit signal DCFd<1> of the delayed data copy flag DCFd<1:2> as the first bit signal SDCF<1> of the synthesis data copy flag SDCF<1:2> while the burst length is set as '16.' The first selection/output circuit 678 may select and output the first bit signal EDCFd<1> of the delayed enlargement data copy flag EDCFd<1:2> as the first bit signal SDCF<1> of the synthesis data copy flag SDCF<1:2> while the burst length is set as '32.'

The second selection/output circuit 679 may generate a second bit signal SDCF<2> of the synthesis data copy flag SDCF<1:2> based on the burst mode signal B32M, the second bit signal DCFd<2> of the delayed data copy flag DCFd<1:2>, and the second bit signal EDCFd<2> of the delayed enlargement data copy flag EDCFd<1:2>. The second selection/output circuit 679 may select and output the second bit signal DCFd<2> of the delayed data copy flag DCFd<1:2> as the second bit signal SDCF<2> of the synthesis data copy flag SDCF<1:2> while the burst length is set as '16.' The second selection/output circuit 679 may select and output the second bit signal EDCFd<2> of the delayed enlargement data copy flag EDCFd<1:2> as the second bit signal SDCF<2> of the synthesis data copy flag SDCF<1:2> while the burst length is set as '32.'

Figure 12:
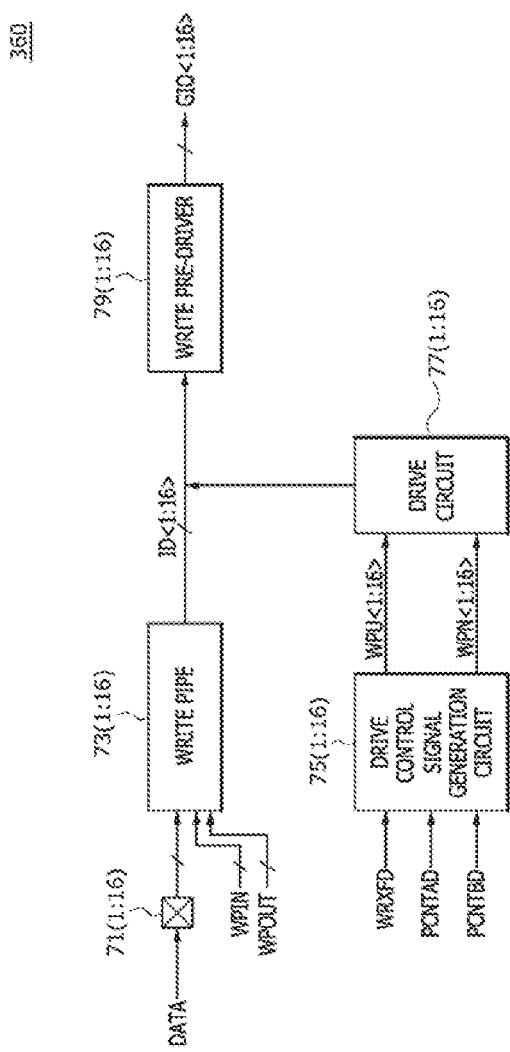
FIG. 12 illustrates a configuration of a pattern mode control circuit included in the semiconductor device of FIG. 2.

FIG. 12 illustrates a configuration of the pattern mode control circuit 360. As illustrated in FIG. 12, the pattern mode control circuit 360 may include a first data pad 71(1:8), a second data pad 71(9:16), a first write pipe 73(1:8), a second write pipe 73(9:16), a first drive control signal generation circuit 75(1:8), a second drive control signal generation circuit 75(9:16), a first drive circuit 77(1:8), a second drive circuit 77(9:16), a first write pre-driver 79(1:8), and a second write pre-driver 79(9:16). The first write pipe 73(1:8) and the first write pre-driver 79(1:8) electrically connected to the first data pad 71(1:8) may constitute the first data path. The second write pipe 73(9:16) and the second write pre-driver 79(9:16) electrically connected to the second data pad 71(9:16) may constitute the second data path. Although FIG. 12 illustrates each of the first and second data pads 71(1:16), the first and second write pipes 73(1:16), the first and second drive control signal generation circuits 75(1:16), the first and second drive circuits 77(1:16), and the first and second write pre-driver 79(1:16) with a single block, each of the first and second data pads 71(1:16), the first and second write pipes 73(1:16), the first and second drive control signal generation circuits 75(1:16), the first and second drive circuits 77(1:16), and the first and second write pre-driver 79(1:16) may be expressed with at least two blocks according to the embodiments.

The first write pipe 73(1:8) may be electrically connected to the first data pad 71(1:8) to receive the data DATA through the first data pad 71(1:8). The first write pipe 73(1:8) may receive and latch the data DATA based on a write input control signal WPIN and may output the latched data as first internal data ID<1:8> based on a write output control signal WPOUT. The second write pipe 73(9:16) may be electrically connected to the second data pad 71(9:16) to receive the data DATA through the second data pad 71(9:16). The second write pipe 73(9:16) may receive and latch the data DATA based on the write input control signal WPIN and may output the latched data as second internal data ID<1:8> based on the write output control signal WPOUT. The write input control signal WPIN and the write output control signal WPOUT may be generated when a write operation is performed while the pattern mode and the data copy mode are inactivated.

The first drive control signal generation circuit 75(1:8) may generate a first write pull-up signal WPU<1:8> and a first write pull-down signal WPN<1:8> based on the delayed pattern mode flag WRXFD and the first delayed pattern control flag PCNTAD. The first drive control signal generation circuit 75(1:8) may generate the first write pull-up signal WPU<1:8> and the first write pull-down signal WPN<1:8> to set a data pattern of the first internal data ID<1:8> according to a logic level of the first delayed pattern control flag PCNTAD while the delayed pattern mode flag WRXFD is generated.

The second drive control signal generation circuit 75(9:16) may generate a second write pull-up signal WPU<9:16> and a second write pull-down signal WPN<9:16> based on the delayed pattern mode flag WRXFD and the second delayed pattern control flag PCNTBD. The second drive control signal generation circuit 75(9:16) may generate the second write pull-up signal WPU<9:16> and the second write pull-down signal WPN<9:16> to set a data pattern of the second internal data ID<9:16> according to a logic level of the second delayed pattern control flag PCNTBD while the delayed pattern mode flag WRXFD is generated.

The first drive circuit 77(1:8) may set logic levels of the data pattern of the first internal data ID<1:8> to a logic "high" level when the first write pull-up signal WPU<1:8> is generated according to a logic level of the first delayed pattern control flag PCNTAD. The first drive circuit 77(1:8) may set logic levels of the data pattern of the first internal data ID<1:8> to a logic "low" level when the first write pull-down signal WPN<1:8> is generated according to a logic level of the first delayed pattern control flag PCNTAD.

The second drive circuit 77(9:16) may set logic levels of the data pattern of the second internal data ID<9:16> to a logic "high" level when the second write pull-up signal WPU<9:16> is generated according to a logic level of the second delayed pattern control flag PCNTBD. The second drive circuit 77(9:16) may set logic levels of the data pattern of the second internal data ID<9:16> to a logic "low" level when the second write pull-down signal WPN<9:16> is generated according to a logic level of the second delayed pattern control flag PCNTBD.

The first write pre-driver 79(1:8) may receive the first internal data ID<1:8> to drive global I/O signals GIO<1:8>. The global I/O signals GIO<1:8> may be driven to have the same logic levels as the first internal data ID<1:8>.

The second write pre-driver 79(9:16) may receive the second internal data ID<9:16> to drive global I/O signals GIO<9:16>. The global I/O signals GIO<9:16> may be driven to have the same logic levels as the second internal data ID<9:16>.

Figure 13:
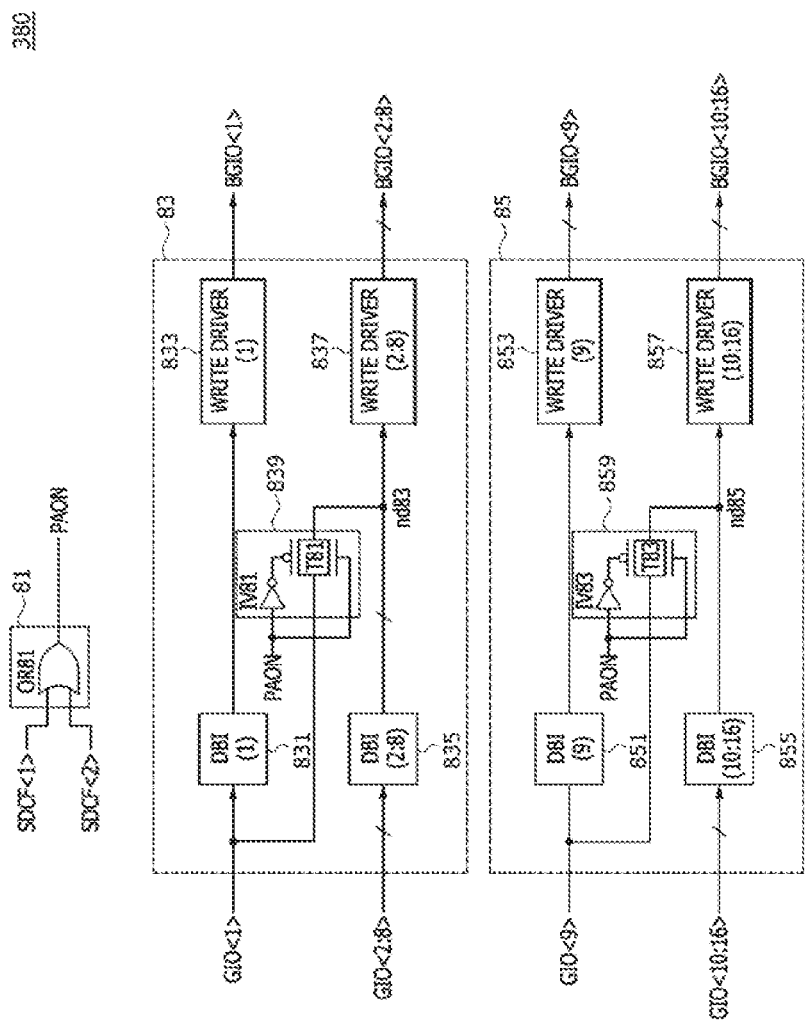
FIG. 13 illustrates a configuration of a data copy control circuit included in the semiconductor device of FIG. 2.

FIG. 13 illustrates a configuration of the data copy control circuit 380. As illustrated in FIG. 13, the data copy control circuit 380 may include a transfer control signal generation circuit 81, a first data copy circuit 83, and a second data copy circuit 85.

The transfer control signal generation circuit 81 may include a OR gate OR81 and may perform a logical OR operation of the first bit signal SDCF<1> of the synthesis data copy flag SDCF<1:2> and the second bit signal SDCF<2> of the synthesis data copy flag SDCF<1:2> to generate a transfer control signal PAON. The transfer control signal generation circuit 81 may generate the transfer control signal PAON having a logic "high" level when the first bit signal SDCF<1> of the synthesis data copy flag SDCF<1:2> or the second bit signal SDCF<2> of the synthesis data copy flag SDCF<1:2> is generated to have a logic "high" level.

The first data copy circuit 83 may include a first data inversion circuit 831, a first write driver 833, a second data inversion circuit 835, a second write driver 837, and a first data transfer circuit 839. The first data inversion circuit 831 may receive the global I/O signal GIO<1> to determine whether the first data inversion circuit 831 inverts the global I/O signal GIO<1> to output the inverted signal of the global I/O signal GIO<1>. The first write driver 833 may drive a bank I/O signal BGIO<1> based on an output signal of the first data inversion circuit 831. The second data inversion circuit 835 may receive the global I/O signals GIO<2:8> to determine whether the second data inversion circuit 835 inverts the global I/O signals GIO<2:8> to output the inverted signal of the global I/O signals GIO<2:8>. The second write driver 837 may drive bank I/O signals BGIO<2:8> based on an output signal of the second data inversion circuit 835. The first data transfer circuit 839 may include an inverter IV81 and a transfer gate T81. The first data transfer circuit 839 may output the global I/O signal GIO<1> to a node nd83 using the transfer gate T81 which is turned on when the transfer control signal PAON is generated to have a logic "high" level. When the transfer control signal PAON has a logic "high" level, the second data inversion circuit 835 may stop to operate and the second write driver 837 may drive the bank I/O signals BGIO<2:8> based on a signal of the node nd83. When the transfer control signal PAON has a logic "high" level, the first data copy circuit 83 may drive the bank I/O signal BGIO<1> based on the global I/O signal GIO<1> and may copy the global I/O signal GIO<1> to drive the bank I/O signals BGIO<2:8>.

The second data copy circuit 85 may include a third data inversion circuit 851, a third write driver 853, a fourth data inversion circuit 855, a fourth write driver 857, and a second data transfer circuit 859. The third data inversion circuit 851 may receive the global I/O signal GIO<9> to determine whether the third data inversion circuit 851 inverts the global I/O signal GIO<9> to output the inverted signal of the global I/O signal GIO<9>. The third write driver 853 may drive a bank I/O signal BGIO<9> based on an output signal of the third data inversion circuit 851. The fourth data inversion circuit 855 may receive the global I/O signals GIO<10:16> to determine whether the fourth data inversion circuit 855 inverts the global I/O signals GIO<10:16> to output the inverted signal of the global I/O signals GIO<10:16>. The fourth write driver 857 may drive bank I/O signals BGIO<10:16> based on an output signal of the fourth data inversion circuit 855. The second data transfer circuit 859 may include an inverter IV83 and a transfer gate T83. The second data transfer circuit 859 may output the global I/O signal GIO<9> to a node nd85 using the transfer gate T83 which is turned on when the transfer control signal PAON is generated to have a logic "high" level. When the transfer control signal PAON has a logic "high" level, the fourth data inversion circuit 855 may stop to operate and the fourth write driver 857 may drive the bank I/O signals BGIO<10:16> based on a signal of the node nd85. When the transfer control signal PAON has a logic "high" level, the second data copy circuit 85 may drive the bank I/O signal BGIO<9> based on the global I/O signal GIO<9> and may copy the global I/O signal GIO<9> to drive the bank I/O signals BGIO<10:16>.

Figure 14:
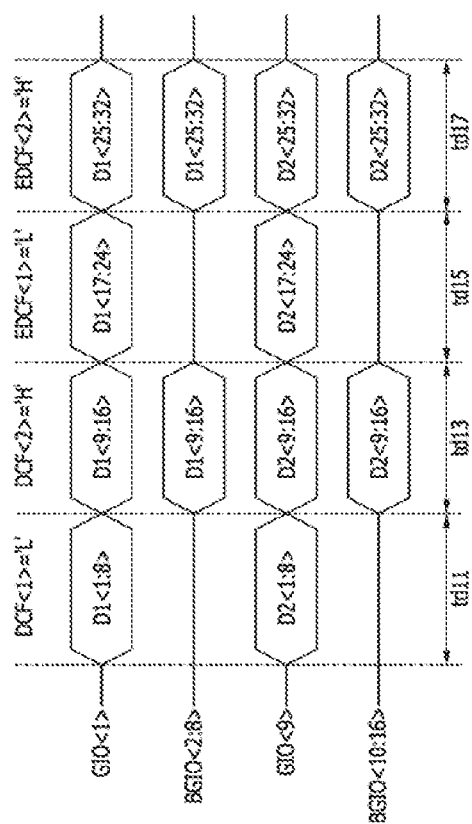
FIG. 14 is a timing diagram illustrating a data copy operation of the semiconductor device shown in FIG. 2.

FIG. 14 is a timing diagram illustrating a data copy operation of the semiconductor device 3. The data copy operation of the semiconductor device 3 will be described hereinafter with reference to FIG. 14 under the assumption that the first bit signal DCF<1> of the data copy flag DCF<1:2> is set to have a logic "low" level, the second bit signal DCF<2> of the data copy flag DCF<1:2> is set to have a logic "high" level, the first bit signal EDCF<1> of the enlargement data copy flag EDCF<1:2> is set to have a logic "low" level, and the second bit signal EDCF<2> of the enlargement data copy flag EDCF<1:2> is set to have a logic "high" level.

When the burst length is set as '32' so that first data D1<1:32> having 32 bits are inputted through the first global I/O signal GIO<1>, the first to eighth bit signals D1<1:8> of the first data D1<1:32> may be inputted during a first period td11, the ninth to sixteenth bit signals D1<9:16> of the first data D1<1:32> may be inputted during a second period td13, the seventeenth to twenty fourth bit signals D1<17:24> of the first data D1<1:32> may be inputted during a third period td15, and the twenty fifth to thirty second bit signals D1<25:32> of the first data D1<1:32> may be inputted during a fourth period td17. The data copy operation for the first to eighth bit signals D1<1:8> of the first data D1<1:32> is not performed by the first bit signal DCF<1> of the data copy flag DCF<1:2>, which is set to have a logic "low" level, during the first period td11. The ninth to sixteenth bit signals D1<9:16> of the first data D1<1:32> may be copied as the second to eighth bank I/O signals BGIO<2:8> by the second bit signal DCF<2> of the data copy flag DCF<1:2>, which is set to have a logic "high" level, during the second period td13. The data copy operation for the seventeenth to twenty fourth bit signals D1<17:24> of the first data D1<1:32> is not performed by the first bit signal EDCF<1> of the enlargement data copy flag EDCF<1:2>, which is set to have a logic "low" level, during the third period td15. The twenty fifth to thirty second bit signals D1<25:32> of the first data D1<1:32> may be copied as the second to eighth bank I/O signals BGIO<2:8> by the second bit signal EDCF<2> of the enlargement data copy flag EDCF<1:2>, which is set to have a logic "high" level, during the fourth period td17.

When the burst length is set as '32' so that second data D2<1:32> having 32 bits are inputted through the ninth global I/O signal GIO<9>, the first to eighth bit signals D2<1:8> of the second data D2<1:32> may be inputted during the first period td11, the ninth to sixteenth bit signals D2<9:16> of the second data D2<1:32> may be inputted during the second period td13, the seventeenth to twenty fourth bit signals D2<17:24> of the second data D2<1:32> may be inputted during the third period td15, and the twenty fifth to thirty second bit signals D2<25:32> of the second data D2<1:32> may be inputted during the fourth period td17. The data copy operation for the first to eighth bit signals D2<1:8> of the second data D2<1:32> is not performed by the first bit signal DCF<1> of the data copy flag DCF<1:2>, which is set to have a logic "low" level, during the first period td11. The ninth to sixteenth bit signals D2<9:16> of the second data D2<1:32> may be copied as the tenth to sixteenth bank I/O signals BGIO<10:16> by the second bit signal DCF<2> of the data copy flag DCF<1:2>, which is set to have a logic "high" level, during the second period td13. The data copy operation for the seventeenth to twenty fourth bit signals D2<17:24> of the second data D2<1:32> is not performed by the first bit signal EDCF<1> of the enlargement data copy flag EDCF<1:2>, which is set to have a logic "low" level, during the third period td15. The twenty fifth to thirty second bit signals D2<25:32> of the second data D2<1:32> may be copied as the tenth to sixteenth bank I/O signals BGIO<10:16> by the second bit signal EDCF<2> of the enlargement data copy flag EDCF<1:2>, which is set to have a logic "high" level, during the fourth period td17.

Figure 15:
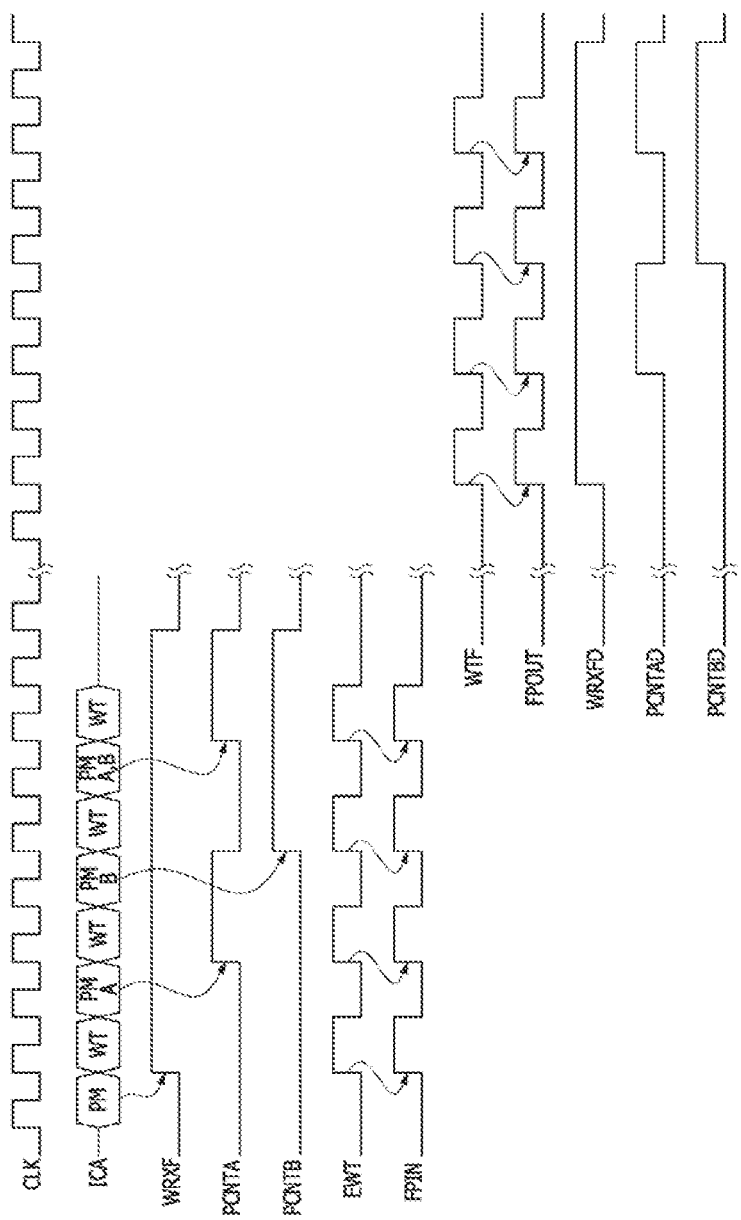
FIGS. 15 and 16 are timing diagrams illustrating an operation of the semiconductor device shown in FIG. 2.
Figure 16:
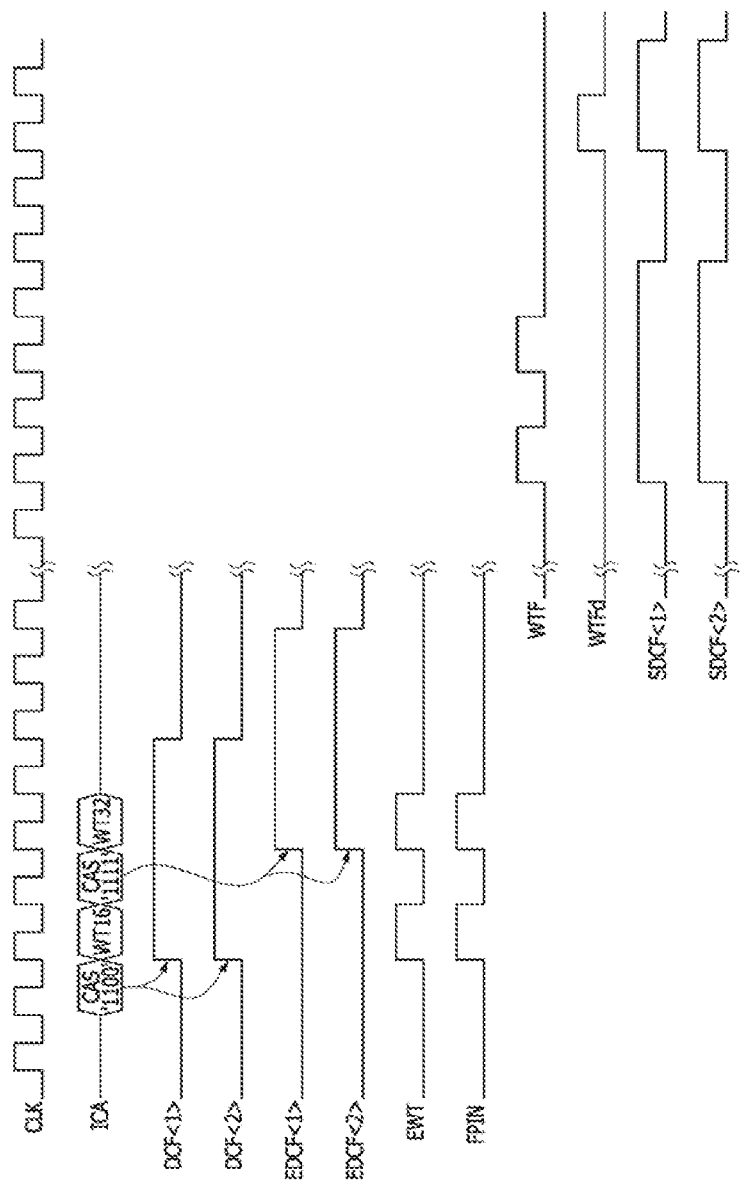

FIGS. 15 and 16 are timing diagrams illustrating an operation of the semiconductor device 3.

As illustrated in FIG. 15, when write operations are successively performed in the pattern mode so that the internal set signal ICA having a logic level combination PM for activating the pattern mode, the internal set signal ICA having a logic level combination WT for the write operation, the internal set signal ICA having a logic level combination PM_A for setting the data pattern on the first data path in the pattern mode, the internal set signal ICA having the logic level combination WT for the write operation, the internal set signal ICA having a logic level combination PM_B for setting the data pattern on the second data path in the pattern mode, the internal set signal ICA having the logic level combination WT for the write operation, the internal set signal ICA having a logic level combination PM_A,B for setting the data pattern on the first and second data paths in the pattern mode, and the internal set signal ICA having the logic level combination WT for the write operation are sequentially inputted, the pattern mode flag WRXF may be generated for eight cycles of the clock signal CLK, the first pattern control flag PCNTA may be repeatedly generated twice for two cycles of the clock signal CLK for each first pattern control flag PCNTA, and the second pattern control flag PCNTB may be generated for four cycles of the clock signal CLK. The pattern mode flag WRXF, the first pattern control flag PCNTA, and the second pattern control flag PCNTB are not toggled when the write operations are successively performed in the pattern mode. Thus, it may be possible to reduce power consumption of the semiconductor device 3.

The pipe input control signal FPIN may be generated in synchronization with the write command EWT which is generated by the internal set signal ICA having the logic level combination WT for the write operation. The pattern mode flag WRXF, the first pattern control flag PCNTA, and the second pattern control flag PCNTB may be latched by the flag pipe (340 of FIG. 2) in synchronization with the pipe input control signal FPIN.

The pipe output control signal FPOUT may be generated in synchronization with the write flag WTF which is generated after a period determined according to the write latency and the burst length elapses from a point in time when the write command EWT is generated. The pattern mode flag WRXF, the first pattern control flag PCNTA, and the second pattern control flag PCNTB latched by the flag pipe (340 of FIG. 2) may be outputted as the delayed pattern mode flag WRXFD, the first delayed pattern control flag PCNTAD, and the second delayed pattern control flag PCNTBD in synchronization with the pipe output control signal FPOUT.

As described above, the semiconductor device 3 according to an embodiment may provide the pattern mode performing the write operation for the data pattern which is set by the internal set signal ICA. In addition, the semiconductor device 3 may latch the pattern mode flag WRXF, the first pattern control flag PCNTA, and the second pattern control flag PCNTB for controlling the pattern mode using the flag pipe (340 of FIG. 2) and may output the latched flags of the pattern mode flag WRXF, the first pattern control flag PCNTA, and the second pattern control flag PCNTB as the delayed pattern mode flag WRXFD, the first delayed pattern control flag PCNTAD, and the second delayed pattern control flag PCNTBD. Thus, the semiconductor device 3 may provide the pattern mode with reduction or minimization of power consumption and a layout area.

As illustrated in FIG. 16, when the write operations are successively performed in the data copy mode so that the internal set signal ICA having a first logic level combination CAS_1100 for the data copy mode, the internal set signal ICA having a logic level combination WT16 for the write operation performed with the burst length of 16, the internal set signal ICA having a second logic level combination CAS_1111 for the data copy mode, and the internal set signal ICA having a logic level combination WT32 for the write operation performed with the burst length of 32 are sequentially inputted, the data copy flag DCF<1:2> may be generated for four cycles of the clock signal CLK, the enlargement data copy flag EDCF<1:2> may be generated for four cycles of the clock signal CLK. The data copy flag DCF<1:2> and the enlargement data copy flag EDCF<1:2> are not toggled when the write operations are successively performed in the data copy mode. Thus, it may be possible to reduce power consumption of the semiconductor device 3.

The pipe input control signal FPIN may be generated in synchronization with the write command EWT which is generated by the internal set signal ICA having the logic level combination WT16 for the write operation performed with the burst length of 16 and the internal set signal ICA having the logic level combination WT32 for the write operation performed with the burst length of 32. The data copy flag DCF<1:2> and the enlargement data copy flag EDCF<1:2> may be latched by the flag pipe (340 of FIG. 2) in synchronization with the pipe input control signal FPIN.

The write flag WTF may be generated after a period determined according to the write latency and the burst length elapses from a point in time when the write command EWT is generated. The delayed write flag WTFd may be generated after a period determined according to the write latency, the burst length, and the bubble period elapses from a point in time when the write command EWT is generated. The data copy flag DCF<1:2> and the enlargement data copy flag EDCF<1:2> latched by the flag pipe (340 of FIG. 2) may be outputted as the synthesis data copy flag SDCF<1:2> based on the write flag WTF and the delayed write flag WTFd As described above, the semiconductor device 3 according to an embodiment may provide the data copy mode for copying data inputted through a data pad onto data paths connected to other data pads. In addition, the semiconductor device 3 may latch the data copy flag DCF<1:2> and the enlargement data copy flag EDCF<1:2> for controlling the data copy mode using the flag pipe (340 of FIG. 2) and may output the latched flags of the data copy flag DCF<1:2> and the enlargement data copy flag EDCF<1:2> as the synthesis data copy flag SDCF<1:2>. Thus, the semiconductor device 3 may provide the data copy mode with reduction or minimization of power consumption and a layout area.

Figure 17:
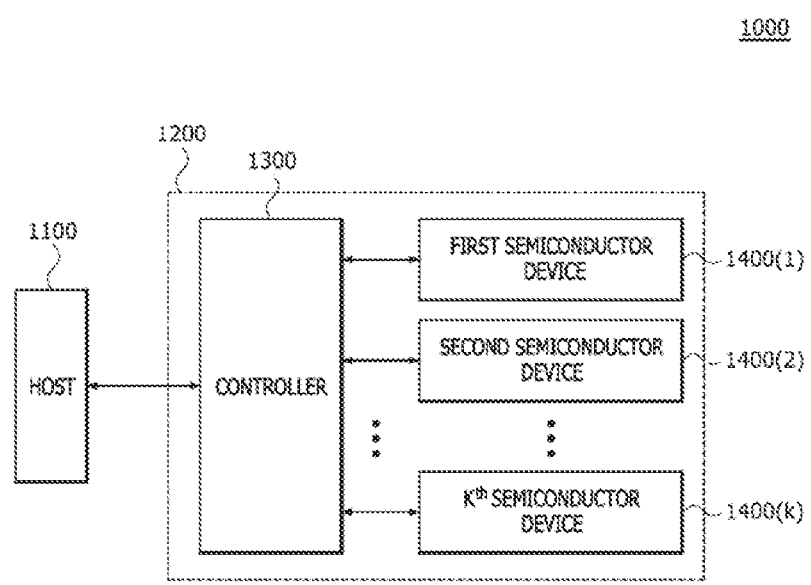
FIG. 17 is a block diagram illustrating a configuration of an electronic system according to an embodiment of the present disclosure.

FIG. 17 is a block diagram illustrating a configuration of an electronic system 1000 including the semiconductor device 3 according to an embodiment.

As illustrated in FIG. 17, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (DATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the write operations in the pattern mode and the data copy mode. Each of the semiconductor devices 1400(K:1) may provide the pattern mode performing the write operation for the data pattern which is set based on the set signal, thereby reducing power consumption during the write operations. Each of the semiconductor devices 1400(K:1) may provide the data copy mode for copying data inputted through a data pad onto data paths connected to other data pads, thereby reducing power consumption during the write operations. Each of the semiconductor devices 1400(K:1) may control points in time when the flags for controlling the pattern mode and the data copy mode are generated using the pipe latch, thereby providing the pattern mode and the data copy mode with reduction or minimization of power consumption and a layout area.

The controller 1300 may be realized using the controller 2 illustrated in FIG. 1. Each of the semiconductor devices 1400(K:1) may be realized using the semiconductor device 3 illustrated in FIGS. 1 and 2. In some embodiments, each of the semiconductor devices 1400(K:1) may be realized using any of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
   a flag pipe configured to latch a pattern mode flag, a first pattern control flag, a second pattern control flag, a data copy flag, and an enlargement data copy flag based on a pipe input control signal and configured to output a delayed pattern mode flag, a first delayed pattern control flag, a second delayed pattern control flag, and a synthesis data copy flag based on a pipe output control signal;
   a pattern mode control circuit configured to set a first data pattern written through a first data path or a second data pattern written through a second data path based on the delayed pattern mode flag, the first delayed pattern control flag, and the second delayed pattern control flag; and
   a data copy control circuit configured to copy data inputted through a first data pad onto a third data path electrically connected to a second data pad based on the synthesis data copy flag.

2. The semiconductor device of claim 1 further comprising a pipe control circuit configured to generate the pipe input control signal based on a write command which is generated to perform a write operation.

3. The semiconductor device of claim 2, wherein the pipe control circuit is configured to generate the pipe output control signal when a period determined according to a write latency and a burst length elapses after a write command is generated.

4. The semiconductor device of claim 1, further comprising a flag generation circuit configured to generate the pattern mode flag, the first pattern control flag, the second pattern control flag, the data copy flag, and the enlargement data copy flag based on an internal set signal and a write command after a write control command is generated based on the internal set signal.

5. The semiconductor device of claim 4, wherein the flag generation circuit is configured to adjust the pulse widths of the pattern mode flag, the first pattern control flag, the second pattern control flag, the data copy flag, and the enlargement data copy flag according to a burst length, a bank mode, and a clock mode.

6. The semiconductor device of claim 1,
   wherein the pattern mode flag is generated to activate a pattern mode based on an internal set signal;
   wherein the first pattern control flag is generated to drive the first data pattern; and
   wherein the second pattern control flag is generated to drive the second data pattern.

7. The semiconductor device of claim 6,
   wherein a logic level of the first data pattern is set according to the first pattern control flag; and
   wherein a logic level of the second data pattern is set according to the second pattern control flag.

8. The semiconductor device of claim 1, wherein the pattern mode control circuit comprises:
   a drive control signal generation circuit configured to generate a first write pull-up signal, a second write pull-up signal, a first write pull-down signal, and a second write pull-down signal based on the delayed pattern mode flag, the first delayed pattern control flag, and the second delayed pattern control flag; and
   a drive circuit configured to drive first internal data and second internal data based on the first write pull-up signal, the second write pull-up signal, the first write pull-down signal, and the second write pull-down signal.

9. The semiconductor device of claim 8, wherein the drive circuit is configured to:
   set the first internal data as the first data pattern based on the first write pull-up signal and the first write pull-down signal; and
   set the second internal data as the second data pattern based on the second write pull-up signal and the second write pull-down signal.

10. The semiconductor device of claim 8, wherein the pattern mode control circuit further comprises:
    a write pipe configured to output the first internal data and the second internal data; and
    a write pre-driver configured to drive a global input/output (I/O) signal based on the first internal data and the second internal data.

11. The semiconductor device of claim 1, wherein the first data path is electrically connected to a third data pad, and the second data path is electrically connected to a fourth data pad.

12. The semiconductor device of claim 1, wherein the data copy control circuit comprises:
    a first data inversion circuit configured to receive a first global I/O signal to determine whether the first data inversion circuit inverts the first global I/O signal to output the inverted signal of the first global I/O signal;
    a write driver configured to drive a bank I/O signal based on an output signal of the first data inversion circuit;
    a second data inversion circuit configured to receive a second global I/O signal to determine whether the second data inversion circuit inverts the second global I/O signal to output the inverted signal of the second global I/O signal; and a data transfer circuit configured to output the first global I/O signal to an output terminal of the second data inversion circuit based on the synthesis data copy flag.

13. A semiconductor device comprising:

a flag generation circuit configured to generate a pattern mode flag, a first pattern control flag, and a second pattern control flag based on an internal set signal and a write command after a write control command is generated based on the internal set signal;

a flag pipe configured to latch the pattern mode flag, the first pattern control flag, and the second pattern control flag based on a pipe input control signal and configured to output a delayed pattern mode flag, a first delayed pattern control flag, and a second delayed pattern control flag based on a pipe output control signal; and a pattern mode control circuit configured to set a first data pattern written through a first data path or a second data pattern written through a second data path based on the delayed pattern mode flag, the first delayed pattern control flag, and the second delayed pattern control flag.

14. The semiconductor device of claim 13 further comprising a pipe control circuit configured to:

generate the pipe input control signal based on a write command which is generated to perform a write operation; and generate the pipe output control signal when a period determined according to a write latency and a burst length elapses after a write command is generated.

15. The semiconductor device of claim 13, wherein the flag generation circuit is configured to adjust the pulse widths of the pattern mode flag, the first pattern control flag, and the second pattern control flag according to a burst length, a bank mode, and a clock mode.

16. The semiconductor device of claim 13, wherein the pattern mode flag is generated to activate a pattern mode based on the internal set signal;

wherein the first pattern control flag is generated to drive the first data pattern; and wherein the second pattern control flag is generated to drive the second data pattern.

17. The semiconductor device of claim 13, wherein the pattern mode control circuit comprises:

a drive control signal generation circuit configured to generate a first write pull-up signal, a second write pull-up signal, a first write pull-down signal, and a second write pull-down signal based on the delayed pattern mode flag, the first delayed pattern control flag, and the second delayed pattern control flag; and a drive circuit configured to drive first internal data and second internal data based on the first write pull-up signal, the second write pull-up signal, the first write pull-down signal, and the second write pull-down signal.

18. The semiconductor device of claim 17, wherein the drive circuit is configured to set the first internal data as the first data pattern based on the first write pull-up signal and the first write pull-down signal and is configured to set the second internal data as the second data pattern based on the second write pull-up signal and the second write pull-down signal.

19. A semiconductor device comprising:

a flag generation circuit configured to generate a data copy flag and an enlargement data copy flag based on an internal set signal and a write command after a write control command is generated based on the internal set signal;

a flag pipe configured to latch the data copy flag and the enlargement data copy flag based on a pipe input control signal and configured to output a synthesis data copy flag based on a pipe output control signal; and a data copy control circuit configured to copy data inputted through a first data pad onto a data path electrically connected to a second data pad based on the synthesis data copy flag.

20. The semiconductor device of claim 19, wherein the data copy control circuit comprises:

a first data inversion circuit configured to receive a first global input/output (I/O) signal to determine whether the first data inversion circuit inverts the first global I/O signal to output the inverted signal of the first global I/O signal;

a write driver configured to drive a bank signal based on an output signal of the first data inversion circuit;

a second data inversion circuit configured to receive a second global I/O signal to determine whether the second data inversion circuit inverts the second global I/O signal to output the inverted signal of the second global I/O signal; and a data transfer circuit configured to output the first global I/O signal to an output terminal of the second data inversion circuit based on the synthesis data copy flag.

* * * * *